United States Patent
Joshi et al.

(10) Patent No.: US 12,062,593 B2
(45) Date of Patent: Aug. 13, 2024

(54) POWER DEVICE ASSEMBLIES AND COOLING DEVICES FOR COOLING HEAT-GENERATING DEVICES

(71) Applicant: Toyota Motor Engineering & Manufacturing North America, Inc., Plano, TX (US)

(72) Inventors: Shailesh N. Joshi, Ann Arbor, MI (US); Ercan Mehmet Dede, Ann Arbor, MI (US); Feng Zhou, Ann Arbor, MI (US); Hiroshi Ukegawa, South Lyon, MI (US); Danny Lohan, Northville, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 551 days.

(21) Appl. No.: 17/217,348

(22) Filed: Mar. 30, 2021

(65) Prior Publication Data

US 2022/0319956 A1    Oct. 6, 2022

(51) Int. Cl.
| | |
|---|---|
| H01L 23/427 | (2006.01) |
| H01L 23/06 | (2006.01) |
| H01L 23/373 | (2006.01) |
| H01L 23/528 | (2006.01) |
| H01L 25/07 | (2006.01) |

(52) U.S. Cl.
CPC ............ *H01L 23/427* (2013.01); *H01L 23/06* (2013.01); *H01L 23/3735* (2013.01); *H01L 23/5286* (2013.01); *H01L 25/074* (2013.01)

(58) Field of Classification Search
CPC ... H01L 23/427; H01L 23/06; H01L 23/3735; H01L 23/5286; H01L 25/074
See application file for complete search history.

(56) References Cited

U.S. PATENT DOCUMENTS

| | | | |
|---|---|---|---|
| 8,035,223 B2 | 10/2011 | Garrou et al. | |
| 9,252,069 B2 | 2/2016 | Bhunia et al. | |
| 9,275,926 B2 | 3/2016 | Hable et al. | |
| (Continued) | | | |

FOREIGN PATENT DOCUMENTS

| | | |
|---|---|---|
| CN | 105890235 A | 8/2016 |
| CN | 205428902 U | 8/2016 |
| (Continued) | | |

OTHER PUBLICATIONS

Thin hybrid capillary two-phase cooling system (https://www.sciencedirect.com/science/article/abs/pii/S0735193320300154), Jan. 28, 2020.

*Primary Examiner* — William B Partridge
*Assistant Examiner* — David Paul Sedorook
(74) *Attorney, Agent, or Firm* — Dinsmore & Shohl LLP

(57) ABSTRACT

A power device assembly includes a heat-generating device, one or more porous bonding layers, and one or more cap layers. The one or more porous bonding layers are formed on a surface of the heat-generating device and define a plurality of embedded vapor channels. The one or more cap layers are engaged with a porous bonding layer of the one or more porous bonding layers opposite the heat-generating device. The one or more cap layer comprise a plurality of liquid feed channels for feeding cooling fluid to the heat-generating device via the porous bonding layer.

20 Claims, 9 Drawing Sheets

(56) References Cited

U.S. PATENT DOCUMENTS

| | | | |
|---|---|---|---|
| 9,879,663 B2 | 1/2018 | Ellis | |
| 2003/0146517 A1* | 8/2003 | Lasky | H01L 23/535 |
| | | | 257/E23.079 |
| 2012/0139096 A1* | 6/2012 | Gohara | H01L 23/3735 |
| | | | 257/E23.101 |
| 2013/0020694 A1* | 1/2013 | Liang | H01L 23/473 |
| | | | 257/691 |
| 2013/0147050 A1 | 6/2013 | Bonner et al. | |
| 2018/0294206 A1* | 10/2018 | Chainer | H01L 21/82 |
| 2022/0087051 A1* | 3/2022 | Muneishi | H01L 23/467 |
| 2022/0352137 A1* | 11/2022 | Wang | H01L 21/50 |

FOREIGN PATENT DOCUMENTS

| | | | | |
|---|---|---|---|---|
| CN | 108054150 A | 5/2018 | | |
| JP | 2014082398 A | 5/2014 | | |
| JP | WO2020158739 A1 * | 11/2021 | | H01L 23/473 |
| KR | 20170039431 A | 4/2017 | | |

* cited by examiner

US 12,062,593 B2

POWER DEVICE ASSEMBLIES AND COOLING DEVICES FOR COOLING HEAT-GENERATING DEVICES

TECHNICAL FIELD

The present specification generally relates to power device assemblies and cooling devices for cooling heat-generating devices and, more specifically, power device assemblies and cooling devices including integrated bonding and cooling layers.

BACKGROUND

As background, power device assemblies may include heat-generating devices, such as power insulated-gate bipolar transistors (IGBTs), which may be used in electric and/or hybrid vehicle applications as switches, for example, to convert DC power to AC power to drive electric motors. Heat-generating devices may generate significant amounts of heat during operation. For example, silicon carbide (SiC) power electronic devices may operate at temperatures up to and/or above 250° C. Accordingly, power device assemblies may need structures configured to provide cooling. These structures may often be large, thereby taking up more space than desirable, leading to a smaller power density. As electronics packaging becomes smaller, it is desirable to provide unique cooling assemblies that balance the desire for efficient cooling which maintaining a small volume profile, thereby increasing power density.

Accordingly, a need exists for alternative power device assemblies having smaller profiles and improved thermal performance.

SUMMARY

In one embodiment, a power device assembly includes a heat-generating device, one or more porous bonding layers, and one or more cap layers. The one or more porous bonding layers are formed on a surface of the heat-generating device and define a plurality of embedded vapor channels. The one or more cap layers are engaged with a porous bonding layer of the one or more porous bonding layers opposite the heat-generating device. The one or more cap layer comprise a plurality of liquid feed channels for feeding cooling fluid to the heat-generating device via the porous bonding layer.

In another embodiment, a power device assembly includes a first chip assembly and a second chip assembly arranged below the first chip assembly in a vertical chip-on-chip power module architecture. Each of the first chip assembly and the second chip assembly include a heat-generating device, one or more porous bonding layers formed on a surface of the heat-generating device and defining a plurality of embedded vapor channels, and one or more cap layers engaged with a porous bonding layer of the one or more porous bonding layers opposite the heat-generating device, the one or more cap layers comprising a plurality of liquid feed channels for feeding cooling fluid to the heat-generating device via the porous bonding layer.

In yet another embodiment, a cooling assembly for a heat generating device, includes a porous bonding layer configured to be arranged on a surface of a heat-generating device, the porous bonding layer defining a plurality of embedded vapor channels, and a cap layer engaged with the porous bonding layer, the cap layer having a plurality of liquid feed channels for feeding cooling fluid through the porous bonding layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

FIGS. 4A-7 depicts various embodiments of power device assemblies having an integrated cooling and bonding layers, which may improve thermal management of the power device assembly while reducing the number of layers within a power device assembly, thereby reducing a size or volume profile of the power device assembly. For example, embodiments of the present disclosure may be directed to power device assemblies that include a heat-generating device, one or more porous bonding layers, and one or more cap layers. The one or more porous bonding layers are formed on a surface of the heat-generating device and define a plurality of embedded vapor channels. The one or more cap layers may be engaged with a porous bonding layer of the one or more porous bonding layers opposite the heat-generating device. The one or more cap layer define a plurality of liquid feed channels for feeding cooling fluid to the heat-generating device via the porous bonding layer, which may allow cooling fluid to directly interface with and remove heat from the heat-generating device. The multifunctional bonding layers thereby provide improved cooling while reducing package volume, and/or the number of layers. Various embodiments of the power device assembly and methods of manufacturing the same will be described in more detail herein.

Figure 1:
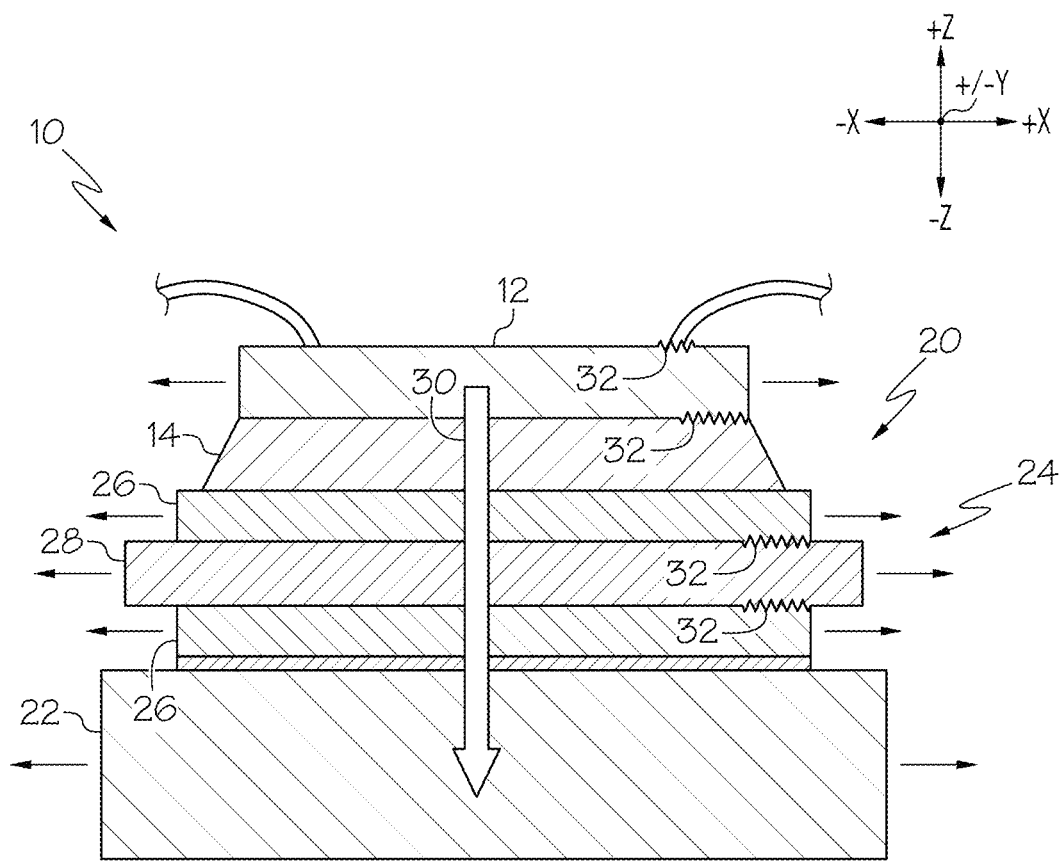
FIG. 1 schematically depicts a power device assembly, according to one or more embodiments shown and described herein.

Referring now to FIG. 1, a power device assembly 10, which may also be referred to herein as a power electronics assembly, is generally depicted. Power device assemblies may include, but are not limited to, a power control unit (PCU) having any number of heat-generating devices, cooling device(s), gate drivers, printed circuit boards (PCB), capacitors, etc. In embodiments, power device assemblies as described herein may be used in vehicle applications for converting DC power to AC power to drive electric motors, though other uses are contemplated and possible. As illustrated in FIG. 1, a power device assembly 10 may include a heat-generating device 12 and a cooling assembly 20 mounted to the heat-generating device 12 via a bonding layer 14.

The heat-generating device 12 may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 12 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the heat-generating device 12 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power device assembly 10.

Accordingly, the heat generated by the heat-generating device 12 may be conducted away via the cooling assembly 20 to cool the heat-generating device 12. The cooling assembly 20 may generally include one or more thermally conductive layers 24 and a cooling device 22 (e.g., a heat sink, vapor chamber, heat pipe, etc.). In one example, the one or more thermally conductive layers 24 may include a DBC (direct bonded copper) substrate. DBC substrates generally include outer copper (other thermally conductive) layers 26 and an inner ceramic, electrically insulative layer 28 (e.g., alumina, aluminum nitride, beryllium oxide, or the like).

The heat-generating device 12 may be bonded to the one or more conductive substrates via the bonding layer 14. For example, the bonding layer 14 may include solder or some other high temperature bonding method. Accordingly, heat generated by the heat-generating device 12 may flow along arrow 30 from the heat-generating device 12 toward the cooling device 22 (e.g., an external single-phase liquid or air cooled device, or the like) to remove heat from the power device assembly 10.

However, as higher power devices are used, (such a SiC devices to achieve high efficiency in a compact space), the high-power density requirement may result in thermal challenges that current cooling structures may not meet. Accordingly, high temperature fatigue from thermal expansion (e.g., in the X direction and/or the Y direction of the depicted coordinate axes) may result in failure or cracking 32 of the various bonding lines between layers of the power device assembly 100 due to, for example, coefficient of thermal expansion (CTE) mismatch between the heat-generating device 12 and the various thermally conductive layers 24. This may lead to mechanical and/or electrical failure of the assembly. Additionally, as power device assemblies become more compact, the use of conventional cooling and/or bonding may become limited due to reduced space. The following embodiments address these concerns through use of compliant bonding layer(s) that provide integrated cooling.

Figure 2A:
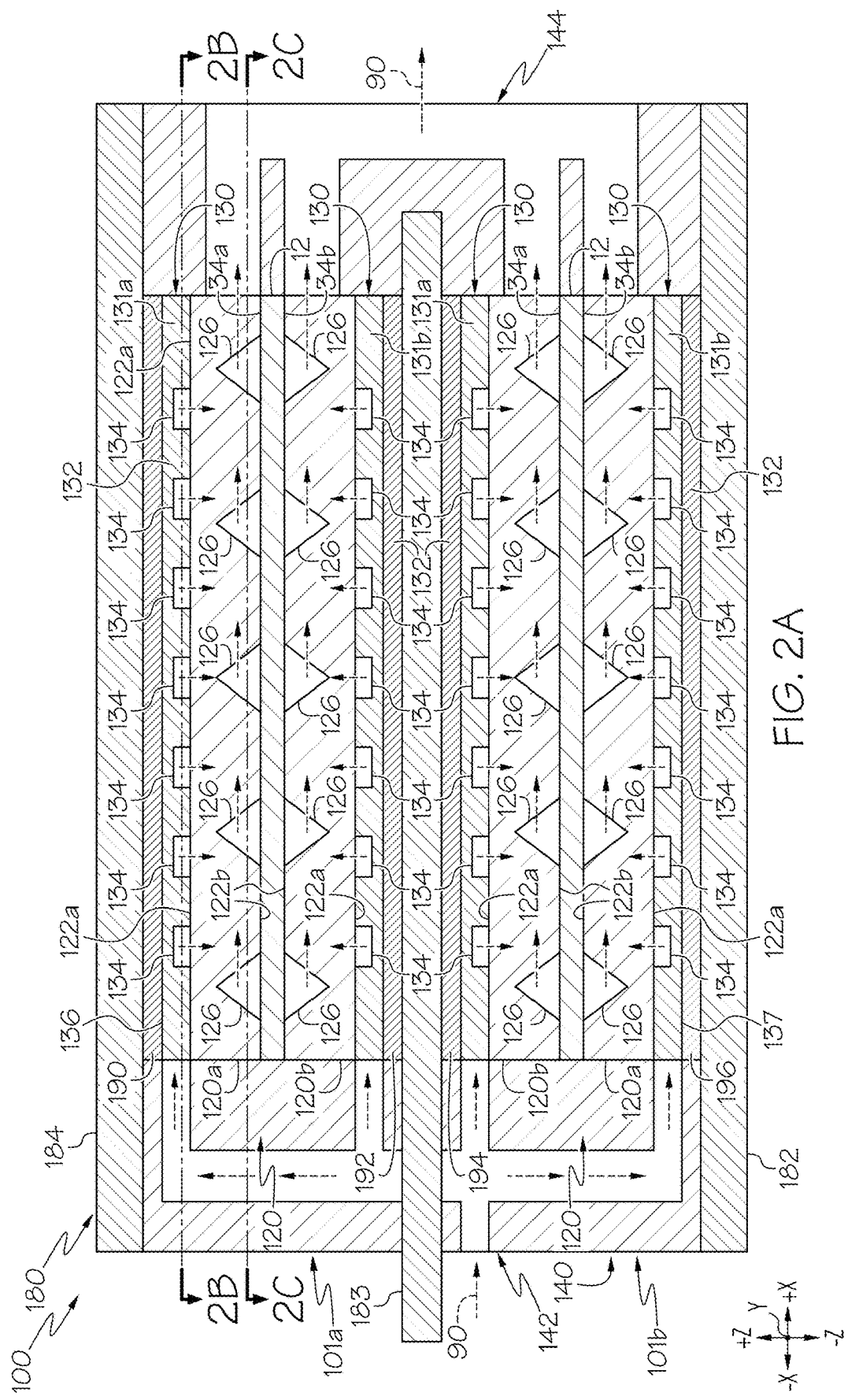
FIG. 2A schematically depicts a power device assembly including integrated power bonding and cooling layers, according to one or more embodiments shown and described herein.
Figure 2C:
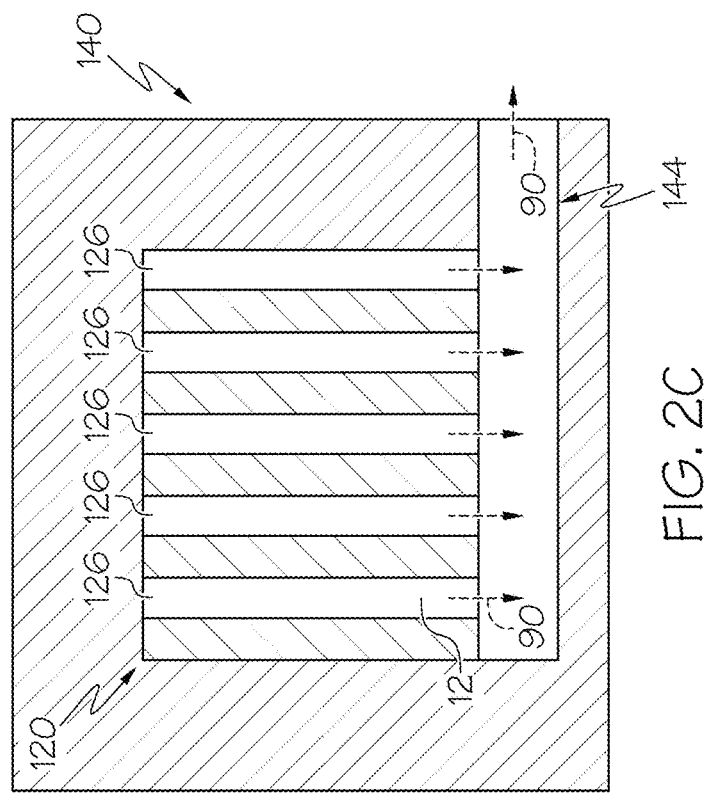
FIG. 2C schematically depicts a second cross-section taken along line 2C-2C of FIG. 2A, according to one or more embodiments shown and described herein.
Figure 2B:
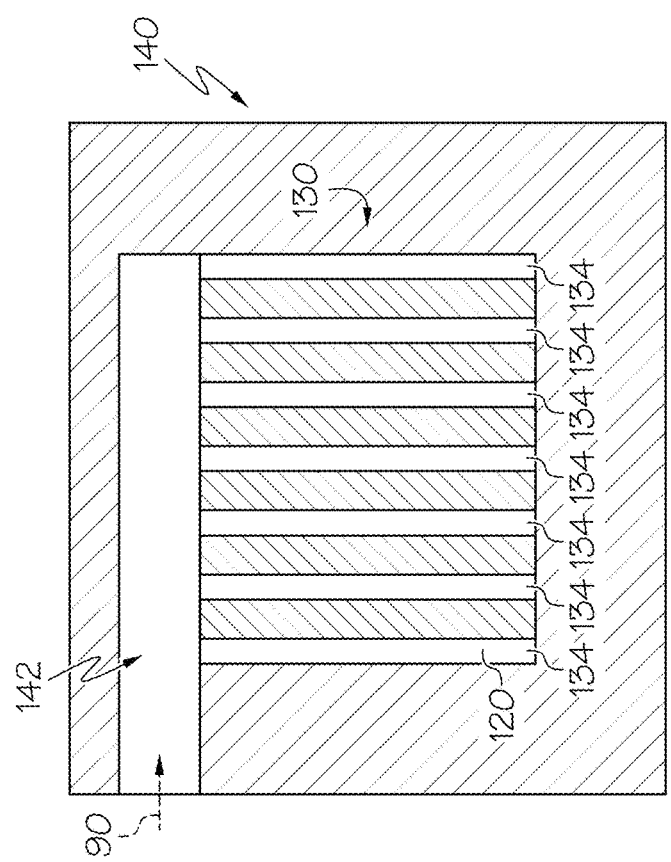
FIG. 2B schematically depicts a first cross-section taken along line 2B-2B of FIG. 2A, according to one or more embodiments shown and described herein.

FIGS. 2A-2C depict a power device assembly 100 including one or more porous bonding layers 120 having a plurality of networked pores 112 (depicted in FIG. 4) that provides passages for cooling fluid (represented by arrows 90) to pass through, as will be explained in greater detail below. In embodiments, the power device assembly 100 includes one or more chip assemblies. For example, a first chip assembly 101*a* and a second chip assembly 101*b* arranged below the first chip assembly 101*a* in a vertical (e.g., in the +/−Z direction of the depicted coordinate axes) chip-on-chip power module architecture. However, it is noted that while the power device assembly 100 generally includes a chip-on-chip power module architecture, other architectures are contemplated and possible (e.g., single chip layer architectures). In embodiments, any number of chip assemblies may be included such as a single chip assemblies, two or more chip assemblies, four or more chip assemblies, six or more chip assemblies, etc.

Each chip assembly 101*a*, 101*b* may include a heat-generating device 12, one or more porous bonding layers 120, and one or more cap layers 130. In some embodiments, and as depicted, the power device assembly 100 may include a resin encasement 140 encasing the first and/or second chip assemblies 101*a*, 101*b*. One or more busbars 180 (e.g., electrode layers) may be mounted to and/or within the resin encasement 140 to provide the relevant electrical topology (e.g., an inverter topology, a converter topology, or the like). Various embodiments of each of these components will now be described in greater detail below.

As noted above, heat-generating devices 12 may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 12 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the heat-generating device 12 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.). Still referring to the present embodiment, each heat-generating device 12 may include a first major surface 34*a* and a second major surface 34*b* opposite the first major surface 34*a*. Each major surface 34*a*, 34*b* may be generally planar and parallel to one another. In embodiments, one or more of the major surfaces 34*a*, 34*b* may be metallized (i.e., coated with a thin layer (e.g., about 3 µm or less of metal such as copper, nickel, silver, or the like) which may provide a bonding surface on which the one or more porous bonding layers 120 may be formed.

The one or more porous bonding layers 120 may be formed on a surface of the heat-generating device 12 (e.g., a metallized surface). For example, a first porous bonding layer 120*a* may be formed on the first major surface 34*a* and a second porous bonding layer 120*b* may be formed on the second major surface 34*b*. In other embodiment, only one or more the major surfaces 34*a*, 34*b* of the heat-generating device 12 may have a porous bonding layer 120 formed thereon. As noted above, the one or more porous bonding layers 120 may be characterized in that the porous bonding layer 120(*s*) comprise a network of interconnected pores 112 (depicted in FIG. 4) which may define a plurality of fluid pathways through the one or more porous bonding layers 120 to the heat-generating device 12. The one or more porous bonding layers 120 may include any thermally conductive porous material, which is capable of bonding two or more materials together (e.g., copper, nickel, silver, gold, and/or any other thermally and/or electrically conductive material). In embodiments, the one or more porous bonding layers 120 may be thin (e.g., between about 10 µm to about 30 µm, such as about 20 µm, though thicker or thinner layers are contemplated and possible. It is accordingly noted that the different components as illustrated in the figures are not drawn to scale and are instead exaggerated to illustrate additional detail. It is further noted that the one or more porous bonding layers 120 may be coextensive with the one or more heat-generating devices 12, as depicted. However, in some embodiments the one or more porous bonding layers 120 may have a smaller or larger area than the one or more heat-generating devices 12.

The one or more porous bonding layers 120 may be formed via any manufacturing technique. However, in embodiments, the one or more porous bonding layers 120 may be formed via an interference lithography process. Interference lithography uses a plurality of laser beams which intersect with one another to create two-dimensional and/or three dimensional structures. For example, FIG. 3 schematically depicts a graphical flowchart of a interference lithography process for manufacturing a porous bonding layer 120 on a heat-generating device 12.

Figure 3:
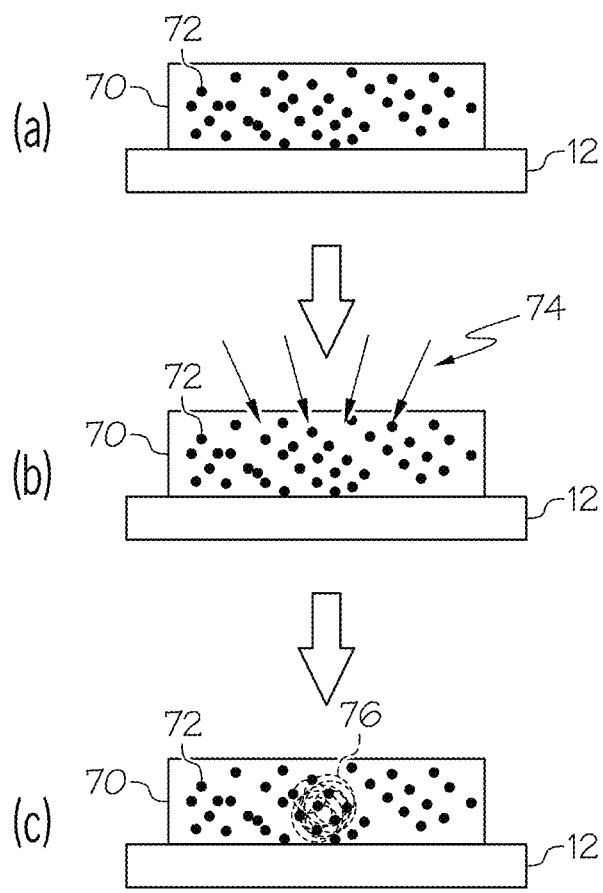
FIG. 3 schematically depicts a process of forming a porous bonding layer, according to one or more embodiments shown and described herein.
Figure 4:
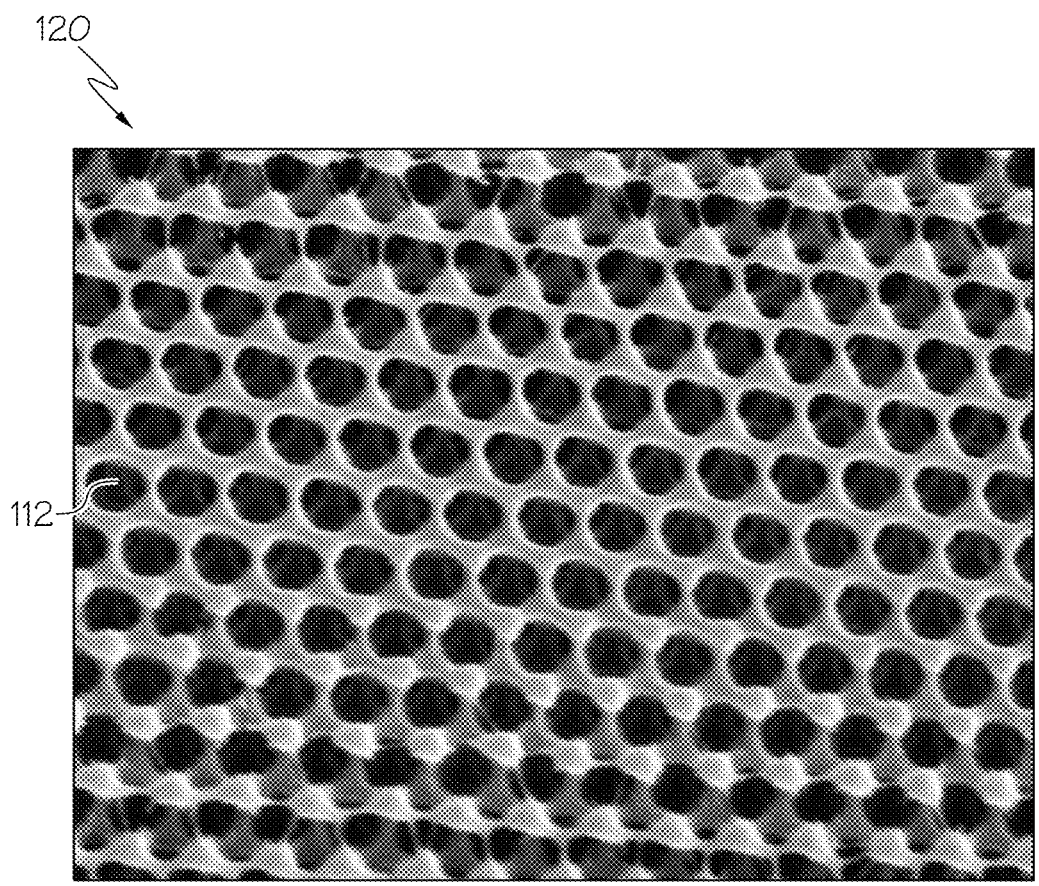
FIG. 4 depicts an image of a porous bonding layer, according to one or more embodiments shown and described herein.

In particular, as illustrated in FIG. 3 at step (a), a photoresist layer 70 (such as, but not limited to, SU-8) may be coated (e.g., spin coated) on the heat-generating device 12 (as noted above, the heat-generating device 12 may include a metalized coating on which the photoresist layer 70 is deposited). The photoresist layer 70 may include a plurality of photoacid generator (PAG) molecules 72 suspended therein. At step (b) the photoresist layer 70 may be irradiated with intersecting laser beams 74 (e.g., two or more laser beams, three or more laser beams, four or more laser beams, etc.). The intersecting lasers beams 74 create constructive interference which may result in formation of two-dimensional and/or three-dimensional patterns formed in the photoresist layer 70. Upon irradiation, the PAG molecules 72 may induce a crosslinking reaction within the photoresist layer 70 to form a networked structure 76, as illustrated at step (c). The networked structure 76 may then be electroplated (e.g., with nickel, silver, gold, and/or any other thermally and/or electrically conductive material) and the photoresist dissolved resulting in a porous bonding layer 120 comprising a plurality of networked pores 112. An exemplary image of a resulting porous bonding layer 120 is depicted in FIG. 4. In embodiments, the pores 112 may be nano-pores on the scale of about 1 nm in diameter to about 1,000 µm in diameter (such as between about 400 nm to about 800 nm in diameter). Though larger or smaller pores are contemplated and possible. Due to the plurality of networked pores 112, the porous bonding layer 120 may have a lower Young's Modulus than that of a traditional bonding layers such a solder. The lower Young's Modulus may allow the porous bonding layer 120 to expand or contract during operation of the power device assembly 100 with greater compliance to maintain bond lines during thermal cycles and reduce thermal fatigue.

Referring again to FIG. 2A, the one or more porous bonding layers 120 may include a plurality of embedded vapor channels 126 formed therein (e.g., two or more embedded vapor channels, four or more embedded vapor channels, six or more embedded vapor channels, etc.). That is, the plurality of embedded vapor channels 126 may include an array of vapor channels arranged along one of a first side 122*a* of the porous bonding layer 120 or a second side 122*b* opposite the first side 122*a* such that the array of vapor channels extend into the porous bonding layer 120 from the first side 122*a* or the second side 122*b*. For example, the first side 122*a* of the porous bonding layer 120 may be arranged against the heat-generating device 12, while the second side 122*b* faces away from the heat-generating device 12. In the illustrated embodiment, the plurality of embedded vapor chambers are arranged along the first side 122*a* of the porous bonding layer 120 and open toward the heat-generating device 12. In other embodiments, the plurality of embedded vapor channels 126 may open away from the heat-generating device 12 such that they are arranged along the second side 122*b* of the porous bonding layer 120. In yet further embodiments, the plurality of embedded vapor channels 126 may extend through the one or more porous bonding layers 120 between the first side 122*a* and the second side 122*b*. It is noted that in some embodiments, the plurality of embedded vapor channels 126 may extend through only a portion of a thickness of the one or more porous bonding layers 120 in the +/-Z direction of the depicted coordinate axes. In other embodiments, it is contemplated that the plurality of embedded vapor channels 126 may extend through an entire thickness of one or more porous bonding layer 120 in the +/-Z direction of the depicted coordinate axes. The plurality of embedded vapor channels 126 may be formed via any manufacturing technique including, but not limited to, etching, carving, boring, or the like.

As will be described in greater detail below, the plurality of embedded vapor channels 126 may allow vapor, produced via boiling of cooling fluid, to exit the porous bonding layer 120. For example, cooling fluid (represented via the arrows 90), such as a dielectric coolant, may be introduced into the one or more porous bonding layers 120. The cooling fluid may be wicked toward the heat-generating device 12 through the plurality of networked pores 112, for example via capillary action, toward the heat-generating device 12. The heat from the heat-generating device 12 causes the cooling fluid to boil and change phase from liquid to vapor. The vapor may then flow through the plurality of embedded vapor channels 126 and out of the one or more porous bonding layers 120, where the cooling fluid may be cooled via one or more cooling devices (e.g., cold plate, heat exchanger, condenser, etc.), not shown, or otherwise allowed to cool.

To aid in delivering cooling fluid to each of the one or more porous bonding layers 120, one or more cap layers 130 may be engaged with the second side 122*b* of the porous bonding layer 120 opposite the heat-generating device 12. The one or more cap layers 130 may be any thermally and/or electrically conductive material (e.g., copper, nickel, silver, gold, and/or any other thermally and/or electrically conductive material). The one or more cap layers 130 may each include a cap body 132 that includes a plurality of liquid feed channels 134 for feeding cooling fluid to the heat-generating device 12 via the one or more porous bonding layers 120. For example, the plurality of liquid feed channels 134 may be formed via any conventional forming technique such as molding, etching, carving, boring, or the like. As depicted, the one or more cap layers 130 may be mounted to the one or more porous bonding layers 120 (e.g., via diffusion bonding, welding, brazing, etc.). In some embodiments, the one or more cap layers 130 may be formed on the one or more porous bonding layers 120 by a direct deposition process (e.g., electroplating).

As depicted, the plurality of liquid feed channels 134 may be interlaced or positioned between the plurality of embedded vapor channels 126 such that the plurality of liquid feed channels 134 are longitudinally (e.g., in the X direction of the depicted coordinate axes) offset from each of the plurality of embedded vapor channels 126. This may ensure that cooling fluid fed through the plurality of liquid feed channels 134 is directed into plurality of networked pores 112 (depicted in FIG. 4) of the porous bonding layer 120 as opposed directing cooling fluid into the plurality of vapor channels, thereby maximizing contact of cooling fluid with the porous bonding layer 120. However, it is noted that the plurality of liquid feed channels 134 may be arranged orthogonally to the plurality of embedded vapor channels 126, such that some of the cooling fluid may be directed into the plurality of embedded vapor channels 126.

Each porous bonding layer of the one or more porous bonding layers 120 may be engaged with a cap layers 130. For example, and as noted above, a first porous bonding layer 120a may be arranged along the first major surface 34a of the heat-generating device 12 and a second porous bonding layer 120b may be arranged along the second major surface 34b of the heat-generating device 12, of each of the first and second chip assemblies 101a, 101b. Accordingly, the one or more cap layers 130 may include a first cap layer 131a engaged with the first porous bonding layer 120a and a second cap layer 131b engaged with the second porous boding layer 120b. In such embodiments, cooling fluid may be directed toward each of the first and second major surfaces 34a, 34b to allow for double-sided cooling.

It is noted that while the one or more cap layers 130 are illustrated as being thinner than the one or more porous bonding layers 120, in embodiments, the one or more cap layers 130 may be thicker (in the Z direction of the depicted coordinate axes) than the one or more porous bonding layers 120. For example, the one or more cap layers 130 have a thickness between about 100 μm to about 500 μm, such as about 200 μm.

It is further noted that while the cross-sections of the plurality of liquid feed channels 134 and/or the plurality of embedded vapor channels 126 are illustrated as having a particular cross-sectional shape, embodiments are not so limited. For example, the cross-section of the plurality of liquid feed channels 134 and/or the plurality of embedded vapor channels 126 may be round, square rectangular, triangular, or any polygonal or non-polygonal shape or combination of polygonal or non-polygonal shapes.

As should be understood, the one or more cap layers 130 and the one or more porous bonding layers 120 may replace the cooling device 22, thermally conductive layers 24, and bonding layer 14 such as depicted in FIG. 1. In this way, several layers may be eliminated, thereby reducing a profile of the power device assembly 100 while providing improved thermal compliance.

Still referring to FIG. 2A, the power device assembly 100 is arranged in a chip-on-chip inverter topology (though other topologies are contemplated and possible as noted above). In such an embodiment, the first chip assembly 101a may be arranged overtop of the second chip assembly 101b. The one or more busbars 180 may be mounted to the first chip assembly 101a and the second chip assembly 101b to provide the desired topology (e.g., electrical connections. For example, the one or more busbars 180 may include an N-busbar 182 (e.g., a negative electrode layer) which may connect the power device assembly 100 to a negative terminal of a power source (e.g., a battery), a P-busbar 184 (e.g., a positive electrode layer) which may connect the power device assembly 100 to a positive terminal of the power source, and an O-busbar 183 (e.g., an output electrode layer) which may connect the power device assembly 100 to an output device (e.g., such as an electric motor of a vehicle).

In embodiments, the P-busbar 184 may be coupled to the first cap layer 131a of the one or more cap layers 130 of the first chip assembly 101a. For example, the P-busbar 184 may be soldered (e.g., via solder layer 190) to an outer-facing surface 136 of the first cap layer 131a of the first chip assembly 101a. The O-busbar 183 may be positioned between and electrically coupled to each of the first chip assembly 101a and the second chip assembly 101b. For example, the heat-generating device 12 of the first chip assembly 101a may be positioned between the P-busbar 184 and the O-busbar 183 along the Z axis of the depicted coordinate axes. In such embodiments, the O-busbar 183 may be soldered to the second cap layer 131b of the first chip assembly 101a (e.g., via solder layer 192) and the first cap layer 131a of the second chip assembly 101b (e.g., via solder layer 194). The N-busbar 182 be coupled to the second cap layer 131b of the one or more cap layers 130 of the second chip assembly 101b. For example, the N-busbar 182 may be soldered (e.g., via solder layer 196) to an outer-facing surface 137 of the second cap layer 131b of the second chip assembly 101b.

The resin encasement 140 may encase the power device assembly 100 and generally provide a housing for the power device assembly 100. For example, the resin encasement 140 may encase at least the heat-generating device(s) 12, the one or more porous bonding layers 120, and the one or more cap layers 130. In some embodiments, the resin encasement 140 may be electrically insulating. The resin encasement 140 may be molded or cast to include one or more fluid inlet paths 142 that fluidically couple to the plurality of liquid feed channels 134 of the one or more cap layers 130, and one or more fluid outlet paths 144 that fluidically couple the plurality of embedded vapor channels 126 of the one or more porous bonding layers 120. The one or more fluid inlet paths 142 may further fluidically couple the plurality of liquid feed channels 134 to a cooling fluid source (e.g., a reservoir, not shown). The one or more fluid outlet paths 144 may fluidically couple the one or more embedded vapor channels 126 to one or more cooling devices as noted above. Accordingly, the resin encasement 140 may define a manifold which directs cooling fluid through the first chip assembly 101a and/or the second chip assembly 101b and thereafter directs resulting vapor out of the power device assembly 10.

FIG. 2B depicts a cross section of FIG. 2A taken along lines 2B-2B through a cap layer of the one or more cap layers 130. As depicted, the one or more fluid inlet paths 142 of the resin encasement 140 may be positioned orthogonal to the plurality of liquid feed channels 134. In embodiments, a single fluid inlet path 142 may direct fluid to each of the plurality of liquid feed channels 134 of a cap layer. However, other configurations are contemplated and possible. A fluid inlet path 142 may be provided for each cap layer of the one or more cap layers 130.

FIG. 2C depicts a cross section of FIG. 2A taken along line 2C-2C through a porous bonding layer 120 of the one or more porous bonding layers 120. As depicted, the one or more fluid outlet paths 144 may be positioned orthogonal to the plurality of embedded vapor channels 126. In the depicted embodiment, a single fluid outlet path 144 receives the vapor from each of the plurality of embedded vapor channels 126 of a porous bonding layer 120. However, other configurations are contemplated and possible. A fluid outlet path 144 may be provided for each porous bonding layer 120 of the one or more porous bonding layers 120.

Referring collectively to FIGS. 2A-2C, during use, the one or more heat-generating devices 12 may receive current via the P-busbar 184 (e.g., from a battery). The one or more heat-generating devices 12 may be switched on and off to convert the current from a direct current to an alternating current which may be supplied to an electric motor of a vehicle, for example, via the O-busbar 183. As noted above, operation of the one or more heat-generating devices 12 may produce large amounts of heat, removal of which may be necessary for continued operation of the power device assembly 100. Accordingly, cooling fluid may be directed (e.g., via a pump, gravity, or the like) through the power device assembly 100 to remove heat from the one or more heat-generating devices 12. As noted above, cooling fluid may be directed through the one or more fluid inlet paths 142 of the resin encasement 140. The cooling fluid may then flow through the plurality of the plurality of liquid feed channels 134 in each of the one or more cap layers 130. The cooling fluid may then be introduced into the one or more porous bonding layers 120, whereby the cooling fluid is wicked through the one or more porous bonding layers 120 toward one or more heat-generating devices 12. The cooling fluid may boil and the resulting vapor may be directed through the plurality of embedded vapor channels 126 to the one or more fluid outlet paths 144 of the resin encasement 140 and out of the power device assembly 10, thereby removing the heat from the power device assembly 100.

Figure 5:
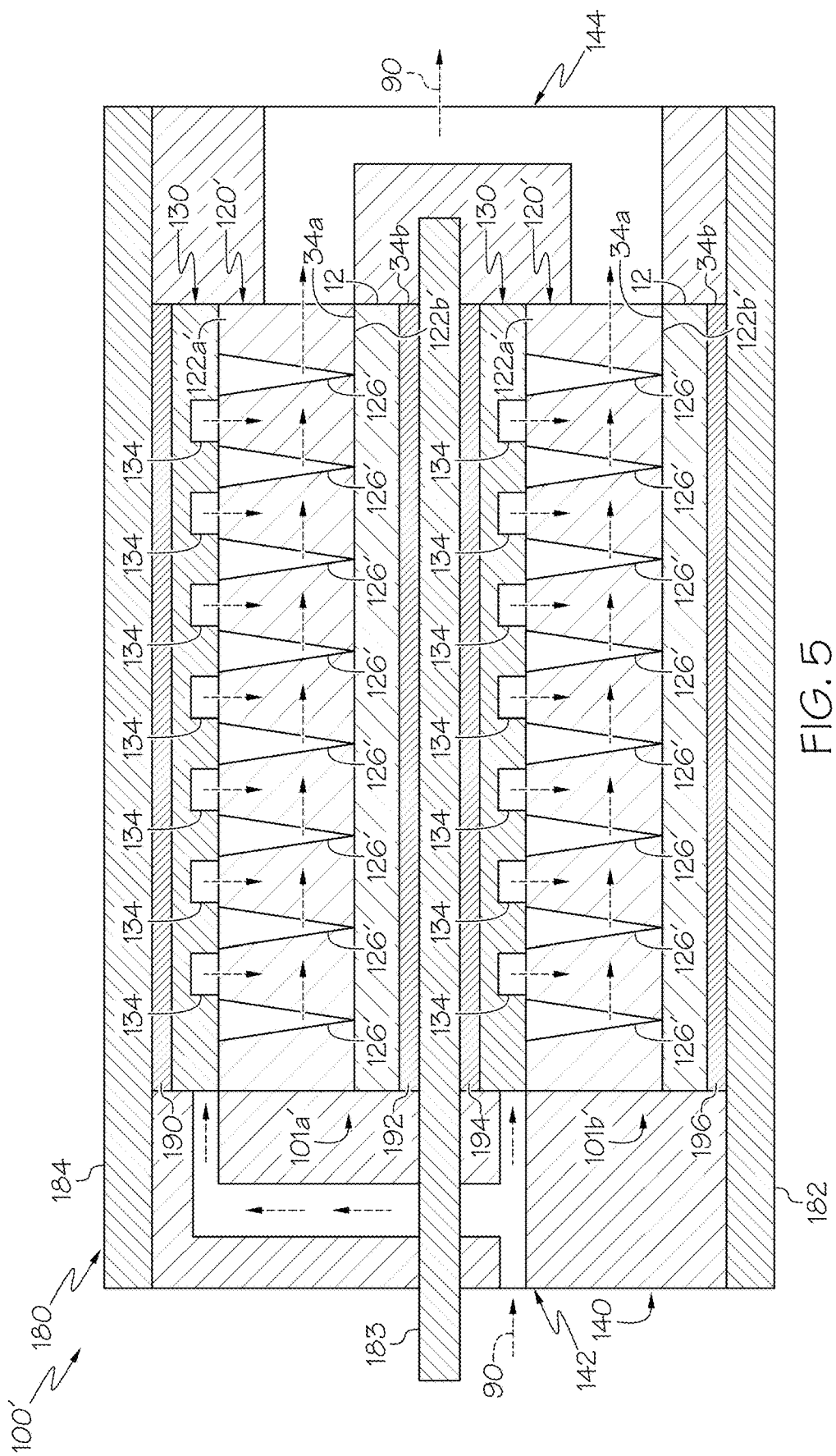
FIG. 5 depicts another embodiment of a power device assembly including integrated cooling and bonding layers, according to one or more embodiments shown and described herein.

FIG. 5 depicts an alternative embodiment of a power device assembly 100'. This embodiment is substantially similar to the above-described embodiment, accordingly the above description is applicable to this embodiments unless otherwise noted or apparent. In particular, in the present embodiment, the plurality of embedded vapor channels 126' extend from the second side 122b' of the porous bonding layer 120', such that the plurality of embedded vapor channels 126' open toward the second side 122b' and taper toward the first side 122a' of the porous bonding layer 120'. Accordingly, in this embodiment, the porous bonding layer 120' thereby provides a diffuser-like liquid-feeding structure while maximizing the amount of porous bonding layer 120' in contact with the heat-generating device 12. This embodiment additionally provides the added benefit of isolating super-heated vapor from the heat-generating device 12. It is noted that while the plurality of embedded vapor channels 126' are illustrated as triangular, they could instead be rectangular, as illustrated in FIG. 6, or any other cross-sectional shape.

Figure 6:
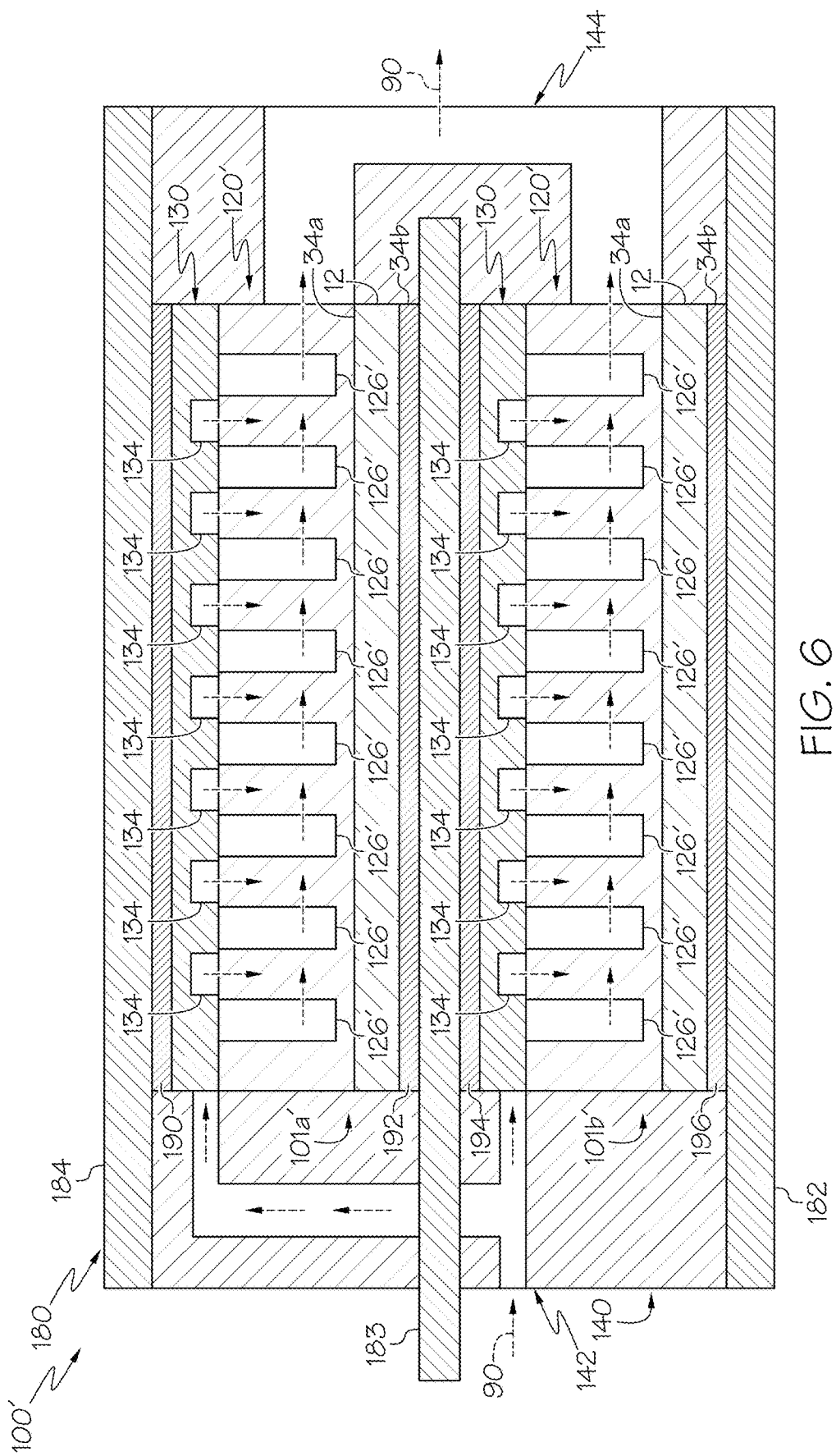
FIG. 6 depicts another embodiment of a power device assembly including integrated cooling and bonding layers, according to one or more embodiments shown and described herein.

Additionally, both FIGS. 5 and 6 illustrate single sided cooling, wherein each heat-generating device 12 is only contacted to a porous bonding layer 120 along one major surface. For example, the heat-generating device 12 of each of the first and second chip assemblies 101a', 101b', only includes a porous bonding layer 120' formed on the first major surface 34a of the heat-generating devices 12, though other configurations are contemplated and possible. In such embodiments, the heat-generating devices 12 may be soldered (e.g., via solder layers 192 and 194) to the O-busbar 183 and the N-busbar 182, respectively. In some embodiments, however, the porous bonding layers 120' may be formed on the second major surfaces 34b of each of the heat-generating devices 12 of the first chip assembly 101a' and the second chip assembly 101b'. In other embodiments the porous bonding layers 120' may be formed on opposite major surfaces of each of the heat-generating devices 12 of the first chip assembly 101a' and the second chip assembly 101b'. However, it is noted, and as described above, a porous bonding layer 120' may be formed on each major surface of the heat-generating devices 12.

Figure 7:
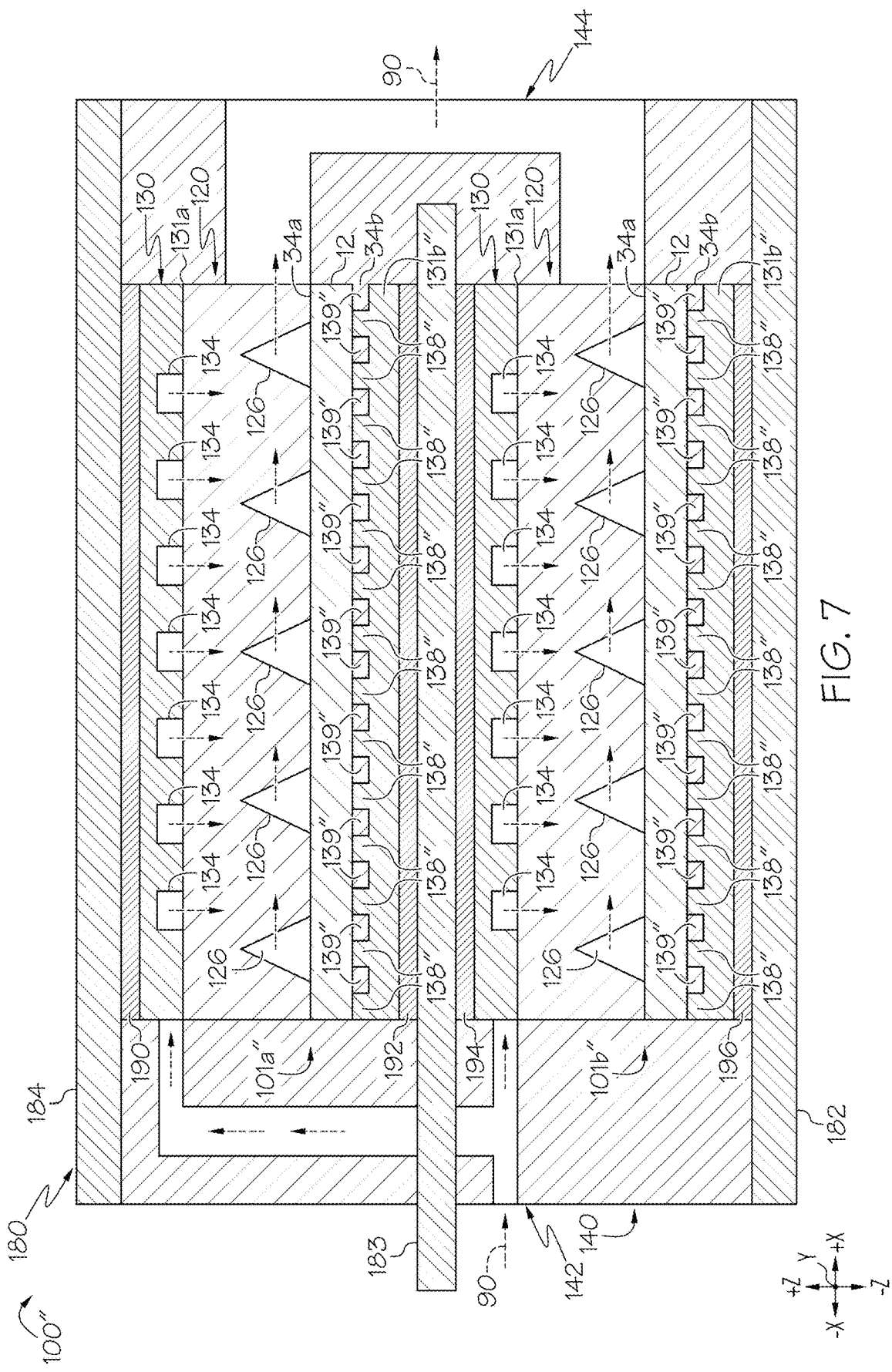
FIG. 7 depicts another embodiment of a power device assembly including integrated cooling and bonding layers, according to one or more embodiments shown and described herein.

FIG. 7 depicts yet another alternative embodiment of a power device assembly 100". This embodiment is substantially similar to the above-described embodiment, accordingly the above description is applicable to this embodiments unless otherwise noted or apparent. In particular, the present embodiment, illustrates single-sided cooling along the first major surface 34a of each heat-generating device 12. That is a porous bonding layer 120 is formed on the first major surface 34a of each heat-generating device 12. However, other configurations are contemplated and possible. For example, the porous bonding layers 120 may be formed on the second major surfaces 34b of each of the heat-generating devices 12 of the first chip assembly 101a and the second chip assembly 101b. In other embodiments the porous bonding layers 120 may be formed on opposite major surfaces 34a of each of the heat-generating devices 12 of the first chip assembly 101a and the second chip assembly 101b.

Additionally, in the present embodiment, a second cap layer 131b" is formed at or coupled to the second major surface 34b of each heat-generating device 12, without an interceding porous bonding layer. For example, the second cap layer 131b" may be directly bonded to the second major surface 34b of each heat-generating device 12. However, other configurations are contemplated and possible. For example, the second cap layer 131b" may be positioned on the first major surfaces 34a of each of the heat-generating devices 12 of the first chip assembly 101a" and the second chip assembly 101b". In other embodiments the second cap layer 131b" may be positioned on opposite major surfaces 34a of each of the heat-generating devices 12 of the first chip assembly 101a" and the second chip assembly 101b".

The second cap layer 131b" may define an array of stress mitigating pillars 138" (e.g., two or more pillars, four or more pillars, six or more pillars, etc.). The array of stress mitigating pillars 138" may define gaps 139" in between each pillar 138". In embodiments, each gap 139" may be the same size, in other embodiments the size of the gaps 139" may vary. The stress mitigating pillars 138" may provide the second cap layer 131b" with flexibility, which may provide better thermal stress responses (e.g., increased compliance in response to thermal expansion). In embodiments, the gap 139" between each pillar 138" may filled with material of the resin encasement 140. It is noted that in this embodiment, the second cap layer 131b may have a reduced height in the Z-direction of the depicted coordinate axes as compared to the first cap layer 131a. For example, the second cap layer 131b may be less than about 200 µm, such as about 20 µm, for example. In some embodiments, the second cap layer 131b may have similar dimensions to the first cap layer 131a, but the height of each pillar in the Z-direction of the depicted coordinate axes may be less than about 50 µm, such as about 20 µm, for example.

Figure 8:
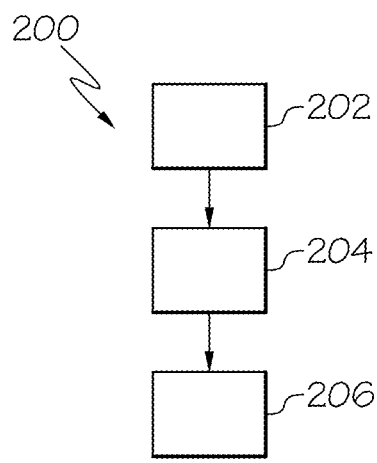
FIG. 8 depicts a flow chart illustrating a method for manufacturing a power device assembly, according to one or more embodiments shown and described herein.

FIG. 8 depicts a flowchart illustrating a method 200 for manufacturing a power device assembly 10. It is noted that while a number of steps are depicted in a particular order, a greater or fewer numbers of steps, in varying orders, may be included without departing from the scope of the present disclosure. At block 202 the method 200 may include forming one or more porous bonding layers 120 on a major surface 34a of a heat-generating device 12 (e.g., the first major surface 34a, the second major surface 34b, or both). For example, in embodiments, the step of forming one or more porous bonding layers 120, at block 202, may include forming a first porous bonding layer 120a on the first major surface 34a of the heat-generating device 12 and forming a second porous bonding layer 120b on the second major surface 34b of the heat-generating device 12. As noted above, in power device assemblies including multiple heat-generating devices 12, the method 200 may include forming a one or more porous bonding layers 120 on a major surface 34a of each of the heat-generating devices 12. As noted above, forming the one or more porous bonding layers 120 may be accomplished via interference lithography.

The method 200 at block 204 may further include mounting one or more cap layers 130 to a porous bonding layer 120 of each of the one or more porous bonding layers 120 opposite the heat-generating device 12. As noted above, the one or more cap layers 130 include the plurality of liquid feed channels 134 for feeding cooling fluid to the heat-generating device 12(s) via the porous bonding layer 120. At block 206 the method 200 may include encasing the heat-generating device 12, the one or more porous bonding layers 120, and the one or more cap layers 130 within a resin encasement 140, as described above. The resin encasement 140 may be molded or cast to include the one or more fluid inlet paths 142 that fluidically couple to the plurality of liquid feed channels 134 of the one or more cap layers 130 of the first and second chip assemblies 101a, 101b and the one or more fluid outlet paths 144 that fluidically couple to the plurality of embedded vapor channels 126 of the one or more porous bonding layers 120 of the first and second chip assemblies 101a, 101b. It is noted in embodiments, the method 200 may further include positioning the one or more busbars 180 within the power device assembly 100 to define an inverter topology, a converter topology, or the like.

It should now be understood that embodiments of the present disclosure are directed to power device assemblies having an integrated cooling and bonding layers, which may improve thermal management of the power device assembly while reducing the number of layers within a power device assembly, thereby reducing a size of the power device assembly. For example, embodiments of the present disclosure may be directed to power device assemblies that include a heat-generating device, one or more porous bonding layers, and one or more cap layers. The one or more porous bonding layers are formed on a surface of the heat-generating device and define a plurality of embedded vapor channels. The one or more cap layers may be engaged with a porous bonding layer of the one or more porous bonding layers opposite the heat-generating device. The one or more cap layer comprise a plurality of liquid feed channels for feeding cooling fluid to the heat-generating device via the porous bonding layer, which may allow cooling fluid to directly interface with and remove heat from the heat-generating device. The multifunctional bonding layers thereby provide improved cooling while reducing package volume.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power device assembly comprising:
   a heat-generating device;
   one or more porous bonding layers formed directly in contact with a surface of the heat-generating device and defining a plurality of embedded vapor channels, and
   one or more cap layers engaged with a porous bonding layer of the one or more porous bonding layers opposite the heat-generating device, the one or more cap layers comprising a plurality of liquid feed channels for feeding cooling fluid into the heat-generating device via the porous bonding layer.

2. The power device assembly of claim 1, further comprising a resin encasement encasing the heat-generating device, the one or more porous bonding layers, and the one or more cap layers.

3. The power device assembly of claim 2, wherein the resin encasement defines:
   one or more fluid inlet paths fluidically coupled to the plurality of liquid feed channels of the one or more cap layers; and
   one or more fluid outlet paths fluidically coupled to the plurality of embedded vapor channels of the one or more porous bonding layers.

4. The power device assembly of claim 1, wherein:
   the heat-generating device comprises a first major surface and a second major surface opposite the first major surface, and
   the one or more porous bonding layers comprise a first porous bonding layer formed on the first major surface of the heat-generating device and a second porous bonding layer formed on the second major surface of the heat-generating device.

5. The power device assembly of claim 4, wherein the one or more cap layers comprise a first cap layer engaged with the first porous bonding layer opposite the heat-generating device and a second cap layer engaged with the second porous bonding layer opposite the heat-generating device.

6. The power device assembly of claim 5, further comprising a busbar coupled to an outer-facing surface of the first cap layer of the one or more cap layers opposite the first porous bonding layer.

7. The power device assembly of claim 1, wherein the power device assembly is arranged in a vertical chip-on-chip power module architecture.

8. A power device assembly comprising:
a first chip assembly; and
a second chip assembly arranged below the first chip assembly in a vertical chip-on-chip power module architecture, wherein each of the first chip assembly and the second chip assembly comprise:
a heat-generating device;
one or more porous bonding layers formed directly in contact with a surface of the heat-generating device and defining a plurality of embedded vapor channels; and
one or more cap layers engaged with a porous bonding layer of the one or more porous bonding layers opposite the heat-generating device, the one or more cap layers comprising a plurality of liquid feed channels for feeding cooling fluid into the heat-generating device via the porous bonding layer.

9. The power device assembly of claim 8, further comprising a resin encasement encasing the first and second chip assemblies.

10. The power device assembly of claim 9, wherein the resin encasement defines:
one or more fluid inlet paths fluidically coupled to the plurality of liquid feed channels of the one or more cap layers of the first and second chip assemblies; and
one or more fluid outlet paths fluidically coupled to the plurality of embedded vapor channels of the one or more porous bonding layers of the first and second chip assemblies.

11. The power device assembly of claim 8, wherein:
the heat-generating device of the first and second chip assemblies comprise a first major surface and a second major surface opposite the first major surface, and
a porous bonding layer of the one or more porous bonding layers of the first and second chip assemblies is arranged on the first major surface the heat-generating device of each of the first and second chip assemblies.

12. The power device assembly of claim 11, wherein the one or more porous bonding layers of the each of the first chip assembly and the second chip assembly comprise a first porous bonding layer formed on the first major surface of the heat-generating device and a second porous bonding layer formed on the second major surface of the heat-generating device.

13. The power device assembly of claim 12, wherein the one or more cap layers of the first chip assembly and the second chip assembly comprise:
a first cap layer engaged with the first porous bonding layer; and
a second cap layer engaged with the second porous bonding layer.

14. The power device assembly of claim 8, wherein the one or more porous bonding layers are formed via interference lithography.

15. The power device assembly of claim 8, further comprising:
a P-busbar coupled to the a cap layer of the one or more cap layers of the first chip assembly;
a O-busbar positioned between and electrically coupled to each of the first chip assembly and the second chip assembly, wherein the heat-generating device of the first chip assembly is positioned between the P-busbar and the O-busbar; and
a N-busbar coupled to a cap layer of the one or more cap layers of the second chip assembly, wherein the heat-generating device of the second chip assembly is positioned between the N-busbar and the O-busbar.

16. A cooling assembly for a heat generating device, the cooling assembly comprising:
a porous bonding layer configured to be arranged directly in contact with a surface of a heat-generating device, the porous bonding layer defining a plurality of embedded vapor channels, and
a cap layer engaged with the porous bonding layer, the cap layer defining a plurality of liquid feed channels for feeding cooling fluid through the porous bonding layer into the heat-generating device.

17. The cooling assembly of claim 16, wherein the plurality of liquid feed channels are longitudinally offset from the plurality of embedded vapor channels, such that cooling fluid is directed from the plurality of liquid feed channels into the porous bonding layer at positions offset from the plurality of embedded vapor channels.

18. The cooling assembly of claim 16, the cooling assembly of claim 16, further comprising a resin encasement comprising:
one or more fluid inlet paths fluidically coupled to the plurality of liquid feed channels; and
one or more fluid outlet paths fluidically coupled to the plurality of embedded vapor channels.

19. The cooling assembly of claim 16, wherein:
the porous bonding layer comprises a first side and a second side opposite the first side; and
the plurality of embedded vapor channels comprises an array of vapor channels extending into the porous bonding layer from the first side.

20. The cooling assembly of claim 19, wherein the array of vapor channels extend through only a portion of a thickness of the porous bonding layer.

* * * * *

UNITED STATES PATENT AND TRADEMARK OFFICE
CERTIFICATE OF CORRECTION

PATENT NO.        : 12,062,593 B2
APPLICATION NO.   : 17/217348
DATED             : August 13, 2024
INVENTOR(S)       : Shailesh N. Joshi et al.

It is certified that error appears in the above-identified patent and that said Letters Patent is hereby corrected as shown below:

In the Claims

In Column 14, Line(s) 33 & 34, Claim 18, delete "The cooling assembly of claim 16, the cooling assembly of claim 16," and insert --The cooling assembly of claim 16,--, therefor.

In Column 14, Line(s) 47, Claim 20, delete "extend" and insert --extends--, therefor.

Signed and Sealed this
Twenty-sixth Day of November, 2024

Katherine Kelly Vidal
*Director of the United States Patent and Trademark Office*